United States Patent
Yu et al.

(10) Patent No.: US 11,860,083 B2
(45) Date of Patent: Jan. 2, 2024

(54) APPARATUS AND METHOD OF TESTING AN OBJECT WITHIN A DRY GAS ENVIRONMENT

(71) Applicant: SAMSUNG ELECTRONICS CO., LTD., Suwon-si (KR)

(72) Inventors: Dahm Yu, Asan-si (KR); Jaehyun Kim, Hwaseong-si (KR); Seonmi Lee, Asan-si (KR); Hyunmin Kwon, Jeonju-si (KR); Sangjun Lee, Cheonan-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 148 days.

(21) Appl. No.: 17/370,090

(22) Filed: Jul. 8, 2021

(65) Prior Publication Data

US 2022/0178815 A1 Jun. 9, 2022

(30) Foreign Application Priority Data

Dec. 7, 2020 (KR) .................. 10-2020-0169442

(51) Int. Cl.
*G01N 19/10* (2006.01)
*G01R 31/28* (2006.01)

(52) U.S. Cl.
CPC ......... *G01N 19/10* (2013.01); *G01R 31/2862* (2013.01); *G01R 31/2881* (2013.01); *G01R 31/2874* (2013.01)

(58) Field of Classification Search
CPC ................. G01N 19/10; G01R 31/2862; G01R 31/2881; G01R 31/2874; G01R 31/2601; G01R 31/2817; G01R 31/2896
See application file for complete search history.

(56) References Cited

U.S. PATENT DOCUMENTS 5,191,282 A * 3/1993 Liken .................. G01R 31/2817
324/757.02
10,627,441 B2 4/2020 Yang et al.
(Continued)

FOREIGN PATENT DOCUMENTS

CN 104034625 A * 9/2014
CN 109564177 A * 4/2019 ............. B64D 15/20
(Continued)

*Primary Examiner* — Rebecca C Bryant
*Assistant Examiner* — Christopher J Gassen
(74) *Attorney, Agent, or Firm* — F. CHAU & ASSOCIATES, LLC (57) ABSTRACT

An apparatus for testing an object may include a test chamber, a first chamber, a second chamber, and a gas supply module. The test chamber receives a test board for testing an object. The first chamber is under the test chamber and receives a lower surface of the test board. The second chamber surrounds the first chamber to isolate the first chamber from ambient air. The gas supply module supplies a dry gas to the second chamber to provide a positive pressure higher than an ambient pressure, thereby preventing the ambient air from infiltrating into the first chamber. Thus, during the testing of the object at a low temperature, the second chamber may prevent the humid ambient air from infiltrating into the first chamber to prevent condensation of water on the lower surface of the test board.

20 Claims, 5 Drawing Sheets

(56) References Cited

U.S. PATENT DOCUMENTS

| | | | |
|---|---|---|---|
| 2011/0227595 A1 | 9/2011 | Takeshita | |
| 2015/0145540 A1 | 5/2015 | Komatsu et al. | |
| 2020/0144637 A1* | 5/2020 | Wagner | H01M 8/04305 |
| 2021/0311111 A1* | 10/2021 | Lou | G01R 31/2881 |

FOREIGN PATENT DOCUMENTS

| | | | | |
|---|---|---|---|---|
| JP | 2008185403 A * | 8/2008 | | |
| JP | 2009-0105339 | 5/2009 | | |
| JP | 2010266282 A * | 11/2010 | | |
| JP | 2019-0149421 | 9/2019 | | |
| KR | 10-2008-0071076 | 8/2008 | | |
| KR | 10-2015-0034230 | 4/2015 | | |
| KR | 20150129884 A * | 11/2015 | | |
| TW | 201337285 A * | 9/2013 | | B65G 49/00 |
| TW | 201403095 A * | 1/2014 | | G01R 31/2889 |
| WO | WO-2017056607 A1 * | 4/2017 | | G01R 31/26 |

\* cited by examiner

APPARATUS AND METHOD OF TESTING AN OBJECT WITHIN A DRY GAS ENVIRONMENT

CROSS-RELATED APPLICATION

This application claims priority under 35 USC § 119 to Korean Patent Application No. 10-2020-0169442, filed on Dec. 7, 2020 in the Korean Intellectual Property Office (KIPO), the contents of which are herein incorporated by reference in their entirety.

TECHNICAL FIELD

The present disclosure relates to an apparatus and a method of testing an object. More particularly, the present disclosure relates to an apparatus and a method of testing a semiconductor package within a dry gas environment.

DISCUSSION OF THE RELATED ART

A semiconductor package may be tested at a low temperature using a test apparatus. The test apparatus may include a test board configured to hold the semiconductor package, and a test chamber configured to receive the test board.

According to related art, a lower surface of the test board may be exposed to air at temperature. Thus, when the test chamber is cooled, water condensation may be generated at the lower surface of the test board.

SUMMARY

An apparatus for testing an object includes a test chamber, a first chamber, a second chamber, and a gas supply module. The test chamber is configured to receive a test board for testing an object. The first chamber is disposed under the test chamber to receive a lower surface of the test board. The second chamber surrounds the first chamber to isolate the first chamber from ambient air. The gas supply module supplies a dry gas to the second chamber to provide the second chamber with a positive pressure that is higher than a pressure of the ambient air, thereby preventing the ambient air from infiltrating into the first chamber.

An apparatus for testing an object includes a test chamber, a first chamber, a second chamber, a compressor, a first gas line, a first valve, a first humidity sensor, a first controller, a second gas line, and a second valve. The test chamber receives a test board for testing an object. The first chamber is disposed under the test chamber to receive a lower surface of the test board. The second chamber at least partially surrounds the first chamber to isolate the first chamber from ambient air. The compressor generates a dry gas supplied to both the first chamber and the second chamber. The first gas line is connected between the compressor and the first chamber. The first valve is disposed at the first gas line to control a supplying of the dry gas to the first chamber. The first humidity sensor is disposed in the first chamber to detect a first humidity in the first chamber. The first controller controls operations of the first valve in accordance with a first humidity in the first chamber detected by the first humidity sensor. The second gas line is connected between the compressor and the second chamber. The second valve is disposed at the second gas line to control a supplying of the dry gas to the second chamber, thereby providing the second chamber with a positive pressure that is higher than an ambient pressure.

A method of testing an object includes maintaining a test chamber at a test temperature. A dry gas is supplied to a first chamber and a second chamber. The first chamber is disposed under the test chamber to receive a lower surface of the test board. The second chamber at least partially surrounds the first chamber to isolate the first chamber from ambient air. When a positive pressure higher than a pressure of the ambient air is provided to the second chamber, a supplying of the dry gas to the first chamber is stopped. The object in the test chamber is then tested.

BRIEF DESCRIPTION OF THE DRAWINGS

Example embodiments of the present disclosure will be more clearly understood from the following detailed description taken in conjunction with the accompanying drawings, wherein.

DETAILED DESCRIPTION OF THE EMBODIMENTS

Hereinafter, example embodiments will be explained in detail with reference to the accompanying drawings.

Figure 1:
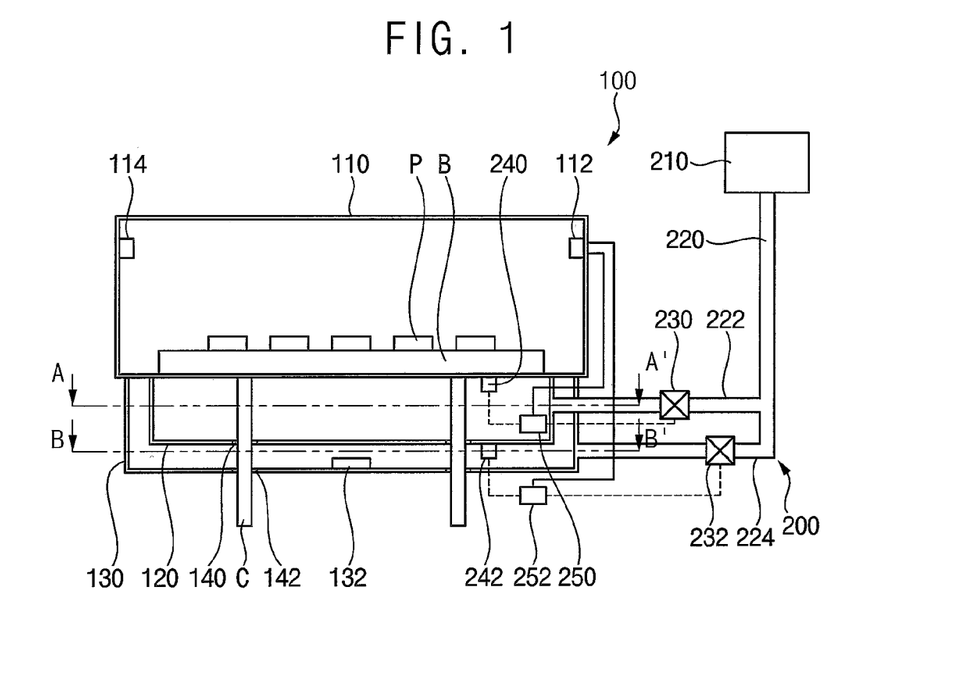
FIG. 1 is a cross-sectional view illustrating an apparatus for testing an object in accordance with example embodiments of the present disclosure.
Figure 2:
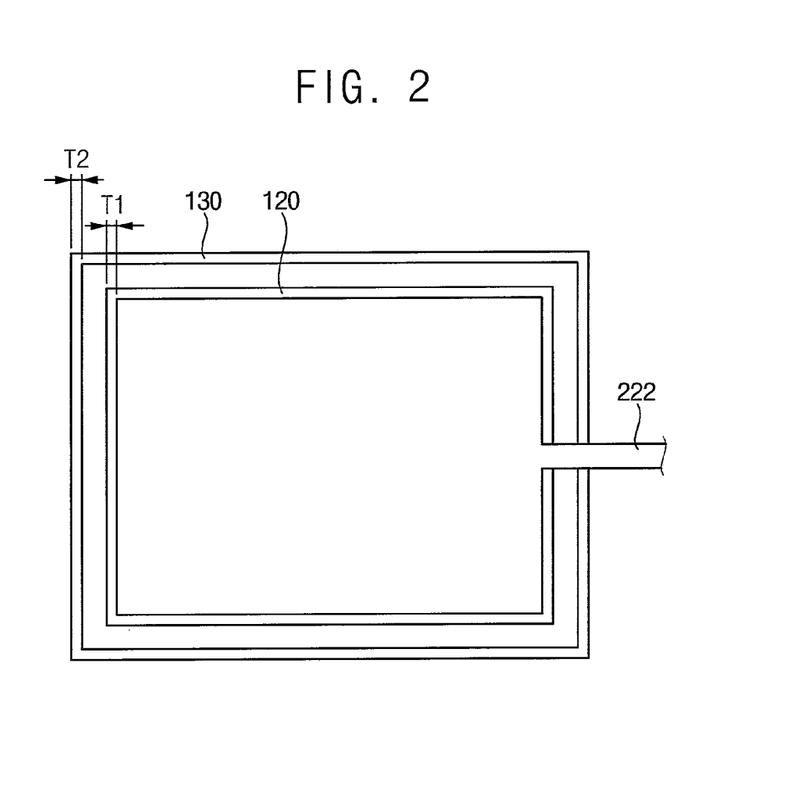
FIG. 2 is a cross-sectional view taken along a line A-A' in FIG. 1.
Figure 3:
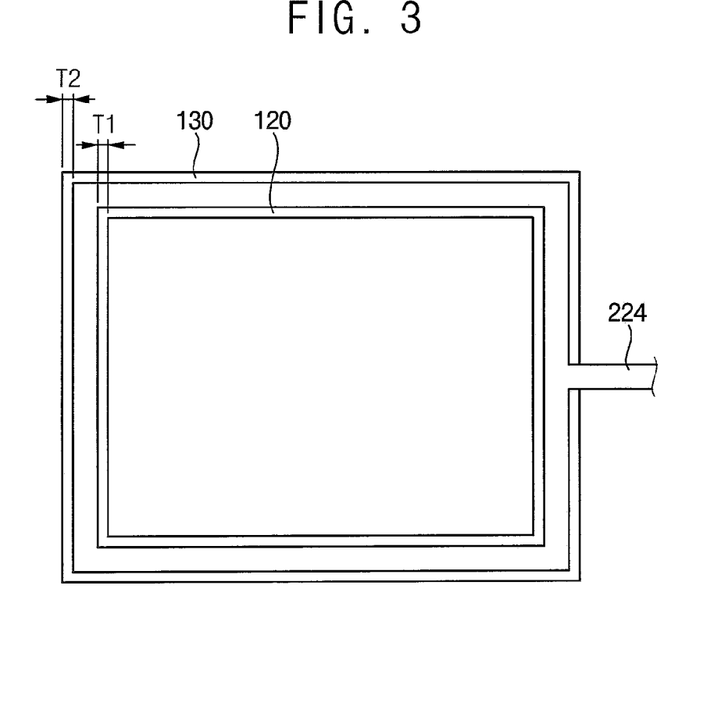
FIG. 3 is a cross-sectional view taken along a line B-B' in FIG. 1.
Figure 4:
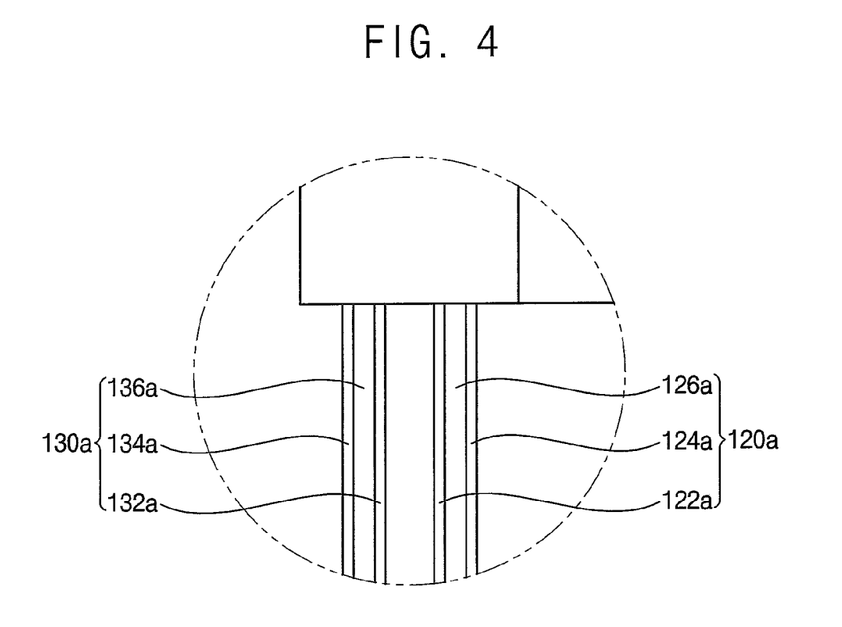
FIG. 4 is an enlarged cross-sectional view illustrating a first chamber and a second chamber of a test apparatus in accordance with example embodiments of the present disclosure.

FIG. 1 is a cross-sectional view illustrating an apparatus for testing an object in accordance with example embodiments of the present disclosure, FIG. 2 is a cross-sectional view taken along a line A-A' in FIG. 1, FIG. 3 is a cross-sectional view taken along a line B-B' in FIG. 1, and FIG. 4 is an enlarged cross-sectional view illustrating a first chamber and a second chamber of a test apparatus in accordance with example embodiments of the present disclosure.

A test apparatus 100 of this example embodiment may test electrical characteristics of an object. For example, the object may include a semiconductor device, for example, a semiconductor package P. For example, the test apparatus 100 may test the semiconductor package P at a low temperature (e.g., a temperature that is lower than room temperature). However, the test apparatus 100 may test the semiconductor package P at a high temperature as well as the low temperature (e.g., at room temperature or above). Further, the object may include other electronic devices besides the semiconductor package P.

Referring to FIGS. 1 to 3, the test apparatus 100 may include a test chamber 110, a first chamber 120, a second chamber 130 and a gas supply module 200.

The test chamber 110 may be configured to receive a test board B. The test board B may be disposed at least partially within the test chamber 110. A plurality of the semiconductor packages P may be mounted on an upper surface of the test board B. The test chamber 110 may include an opening configured to receive the test board B. The opening may be formed through a central portion of a lower surface of the test chamber 110. Thus, the lower surface of the test board B may be exposed by the opening. At least one cable C for supplying power to the test board B may be connected to the lower surface of the test board B.

A temperature sensor 112 may be attached to an inner wall of the test chamber 110. The temperature sensor 112 may measure an internal temperature of the test chamber 110.

A temperature controller 114 may be disposed in the test chamber 110. The temperature controller 114 may maintain the test chamber 110 at a test temperature, for example, by providing a desired degree of chilling.

When the semiconductor package P may be tested at the low temperature, the test chamber 110 may be brought to and maintained at the low temperature. The upper surface of the test board B may be positioned in the test chamber 110. The lower surface of the test board B may be exposed to an outside of the test chamber 110. For example, the lower surface of the test board B may be directly exposed to ambient air. Thus, a temperature difference may be generated between the test board B and water may condense on the lower surface of the test board B. This water condensation may cause an electrical short between conductive lines in the test board B due to ion migrations. In order to prevent the condensation of water on the lower surface of the test board B, the first chamber 120 and the second chamber 130 may be arranged under the test chamber 110, thereby protecting the lower surface of the test board B from the ambient air.

The first chamber 120 may be disposed under the test chamber 110. For example, the first chamber 120 may have an upper end making contact with the lower surface of the test chamber 110. Further, the first chamber 120 may have area volume larger than area volume of the test board B. For example, the first chamber 120 may receive the lower surface of the test board B. For example, the lower surface of the test board B may be exposed to the first chamber 120.

The cable C may pass through a first hole formed through a lower surface of the first chamber 120. In order to provide a seal between the cable C and an inner surface of the first hole, a first gasket 140 may be disposed between the cable C and the inner surface of the first hole.

The first chamber 120 may have a first wall thickness T1. Further, the first chamber 120 may have a first volume V1. The first volume V1 may be defined by an inner surface of the first chamber 120, the lower surface of the test board B and a portion of the lower surface of the test chamber 110 between the upper end of the first chamber 120 and the lower surface of the test board B.

In order to prevent the test board B from being warmed to room temperature, the first chamber 120 may include a heat-insulating material so that the first chamber 120 may be an adiabatic barrier. For example, the first chamber 120 may include an epoxy, but the present invention is not necessarily limited thereto.

Alternatively, as shown in FIG. 4, a first chamber 120a may have a double tubular shape including an inner tube 122a, an outer tube 124a and an adiabatic layer 126a between the inner tube 122a and the outer tube 124a. The adiabatic layer 126a may include air. Additionally, a heat-insulating material may be disposed in the adiabatic layer 126a.

The second chamber 130 may be disposed under the test chamber 110. The second chamber 130 may at least partially surround the first chamber 120. The second chamber 130 may include an upper end in contact with the lower surface of the test chamber 110. For example, the second chamber 130 may have area volume smaller than the volume of the first chamber 120. For example, the second chamber 130 may be disposed around an outer surface of the first chamber 120. Thus, the second chamber 130 may isolate the first chamber 120 from ambient air.

A pressure sensor 132 may be disposed in the second chamber 130. The pressure sensor 132 may measure an internal pressure of the second chamber 130.

The cable C may pass through a second hole formed through a lower surface of the second chamber 130. For example, the cable C may be connected to the lower surface of the test board B through the second hole and the first hole. In order to establish a seal between the cable C and an inner surface of the second hole, a second gasket 142 may be disposed between the cable C and the inner surface of the second hole.

The second chamber 130 may have a second wall thickness T2. The second wall thickness T2 may be thicker than the first wall thickness T1. The isolation of the test board B from the ambient air may be mainly performed by the second chamber 130. Thus, although the first wall thickness T1 of the first chamber 120 may be thinner than the second wall thickness T2 of the second chamber 130, the test board B might not be exposed to the ambient air.

Further, the second chamber 130 may have a second volume V2. The second volume V2 may be defined by an inner surface of the second chamber 130, the outer surface of the first chamber 120 and a portion of the lower surface of the test chamber 110 between the first chamber 120 and the second chamber 130. For example, the second volume V2 may be smaller than the first volume V1.

In order to prevent a temperature of the ambient air from warming the test board B, the second chamber 130 may include a heat insulating material and so the second chamber 130 may be an adiabatic barrier. For example, the second chamber 130 may include an epoxy, but the present invention is not necessarily limited thereto.

Alternatively, as shown in FIG. 4, a second chamber 130a may have a double tubular shape including an inner tube 132a, an outer tube 134a, and an adiabatic layer 136a between the inner tube 132a and the outer tube 134a. The adiabatic layer 136a may include air. Additionally, a heat insulating material may be disposed in the adiabatic layer 136a.

The gas supply module 200 may selectively supply a dry gas to the first chamber 120 and the second chamber 130. The gas supply module 200 may include a compressor 210, a main gas line 220, a first gas line 222, a second gas line 224, a first valve 230, a second valve 232, a first humidity sensor 240, a second humidity sensor 242, a first controller 250, and a second controller 252.

The compressor 210 may be configured to generate the dry gas. The dry gas may have a predetermined pressure. The dry gas may include a dry air (e.g., low-humidity air), however, the present invention is not necessarily limited thereto.

The main gas line 220 may be extended from the compressor 210. Thus, the dry gas generated from the compressor 210 may be supplied through the main gas line 220.

The first gas line 222 may be branched from the main gas line 220. The first gas line 222 may be connected to the first chamber 120. The dry gas may be supplied to the first chamber 120 through the first gas line 222. In example embodiments of the present disclosure, the first gas line 222 may include a single line connected to a side surface of the first chamber 120.

The first valve 230 may be installed at the first gas line 222. The first valve 230 may control an amount of the dry gas supplied through the first gas line 222. For example, the first valve 230 may control the amount of the dry gas supplied to the first chamber 120.

The first humidity sensor 240 may be arranged in the first chamber 120. The first humidity sensor 240 may measure a first humidity in the first chamber 120. Because the water condensation may be generated on the lower surface of the test board B, the first humidity sensor 240 may be attached to the lower surface of the test board B. Alternatively, the first humidity sensor 240 may be attached to an inner wall of the first chamber 120.

The first controller 250 may receive the first humidity measured by the first humidity sensor 240. The first controller 250 may control operations of the first valve 230, i.e., opening angles of the first valve 230 in accordance with the first humidity. Further, the first controller 250 may receive the internal temperature of the test chamber 110 measured by the temperature sensor 112.

For example, when the first humidity measured by the first humidity sensor 240 is higher than a set humidity in the first chamber 120, the first controller 250 may open the first valve 230. The dry gas may be supplied to the first chamber 120 by opening the first valve 230 to decrease the first humidity in the first chamber 120. In contrast, when the first humidity measured by the first humidity sensor 240 is less than or equal to the set humidity in the first chamber 120, the first controller 250 may close the first valve 230. The supply of dry gas to the first chamber 120 may be interrupted by closing the first valve 230.

The second gas line 224 may be branched from the main gas line 220. The second gas line 224 may be connected to the second chamber 130. The dry gas may be supplied to the second chamber 130 through the second gas line 224. In example embodiments of the present disclosure, the second gas line 224 may include a single line connected to a side surface of the second chamber 130.

The second valve 232 may be installed at the second gas line 224. The second valve 232 may control an amount of the dry gas supplied through the second gas line 224. For example, the second valve 232 may control the amount of the dry gas supplied to the second chamber 130.

The second humidity sensor 242 may be disposed in the second chamber 130. The second humidity sensor 242 may measure a second humidity in the second chamber 130.

The second controller 252 may receive the second humidity measured by the second humidity sensor 242. The second controller 252 may control operations of the second valve 232, i.e., opening angles of the second valve 232 in accordance with the second humidity. Further, the second controller 252 may receive an internal pressure of the second chamber 130 measured by a pressure sensor 132. The second controller 252 may receive the internal temperature of the test chamber 110 measured by the temperature sensor 112.

Controls of the second valve 232 in accordance with the second humidity may initialize and monitor the test chamber 110. After initializing the test apparatus 100, the second humidity of the second chamber 130 might not have a close relationship with the humidity of the test chamber 110 in which the test process is performed. However, when the second humidity is higher than the set humidity, the test apparatus 100 may be assumed to be abnormal. In this case, the second controller 252 may open the second valve 232 to supply the dry gas to the second chamber 130. When the second humidity of the second chamber 230 does not decrease in spite of the supplying of the dry gas, the test apparatus 100 may be stopped. The test apparatus 100 may then be repaired.

In example embodiments of the present disclosure, the gas supply module 200 may include the first controller 250 and the second controller 252. Alternatively, the gas supply module 200 may include a single controller configured to control the first valve 230 and the second valve 232.

The dry gas supplied to the second chamber 130 may provide the second chamber 130 with a positive pressure that is higher than the pressure of the ambient air (e.g., the ambient pressure). Because the pressure of the second chamber 130 may be higher than the pressure of the ambient air, the humid ambient air might not pass through the second chamber 130. Thus, the second chamber 130 may function to prevent the ambient air from infiltrating into the first chamber 120. As a result, the second chamber 130 may be configured to isolate the first chamber 120 from the ambient air.

In order to provide the second chamber 130 with the above-mentioned functions, the positive pressure may be applied to the second chamber 130. The second controller 252 may continuously open the second valve 232 until the positive pressure may be formed in the second chamber 130. After providing the second chamber 130 with the positive pressure, the second controller 252 may reduce the opening angle of the second valve 232 with the positive pressure of the second chamber 130 being maintained. Thus, the amount of the dry gas supplied to the second chamber 130 may be decreased.

After stopping the supplying of the dry gas to the first chamber 120 during the performance of the low temperature test, the dry gas supplied to the second chamber 130 may maintain the positive pressure of the second chamber 130. Thus, a positive pressure of the first chamber 120 to which the dry gas may be continuously supplied may be slightly higher than the positive pressure of the second chamber 130 to which the dry gas might not be supplied any more. As mentioned above, because the second volume V2 of the second chamber 130 may be smaller than the first volume V1 of the first chamber 120, an amount of the dry gas used in the low temperature test may be reduced.

After stopping the supplying of the dry gas to the first chamber 120, the first chamber 120 may be isolated from the ambient air by the second chamber 130. Thus, transferring the temperature of the ambient air to the first chamber 120 may be suppressed. As a result, transferring the temperature of the ambient air to the test board B and the semiconductor package P through the first chamber 120 may also be suppressed. Further, the dry gas in the first chamber 120 might not be moved to the test chamber 110, the second chamber 130 and/or the outside. Thus, a low temperature of the test chamber 110 may cool the dry gas in the first chamber 120 during the low temperature test. The cooled dry gas may continuously remain in the isolated first chamber 120 to decrease temperature variances of the test board B and the semiconductor package P. As a result, a time for providing the test chamber 110 with the test temperature may be greatly reduced and a temperature variance in the test chamber 110 may also be decreased in the low temperature test.

Figure 5:
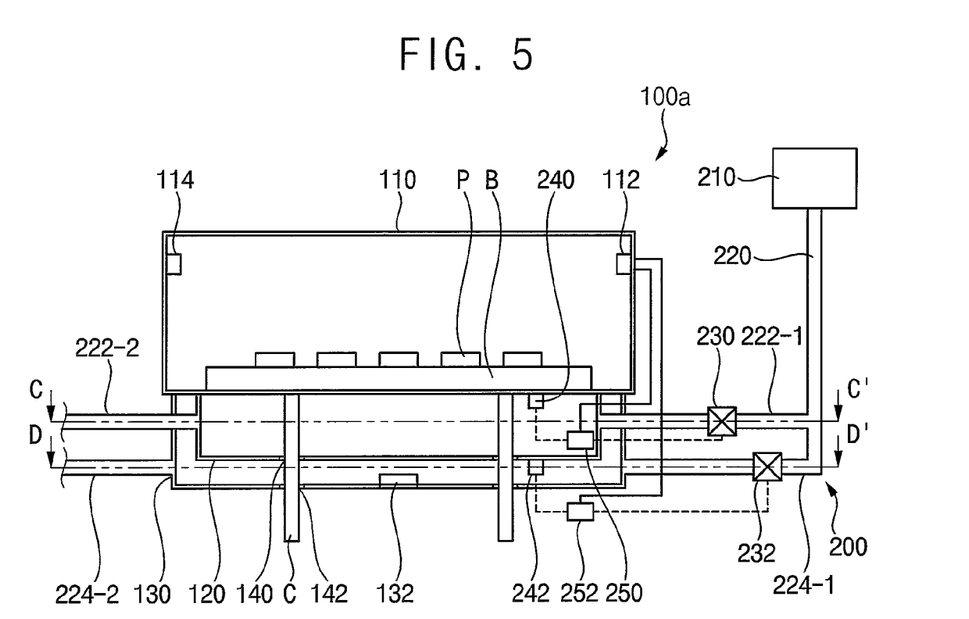
FIG. 5 is a cross-sectional view illustrating an apparatus for testing an object in accordance with example embodiments of the present disclosure.
Figure 6:
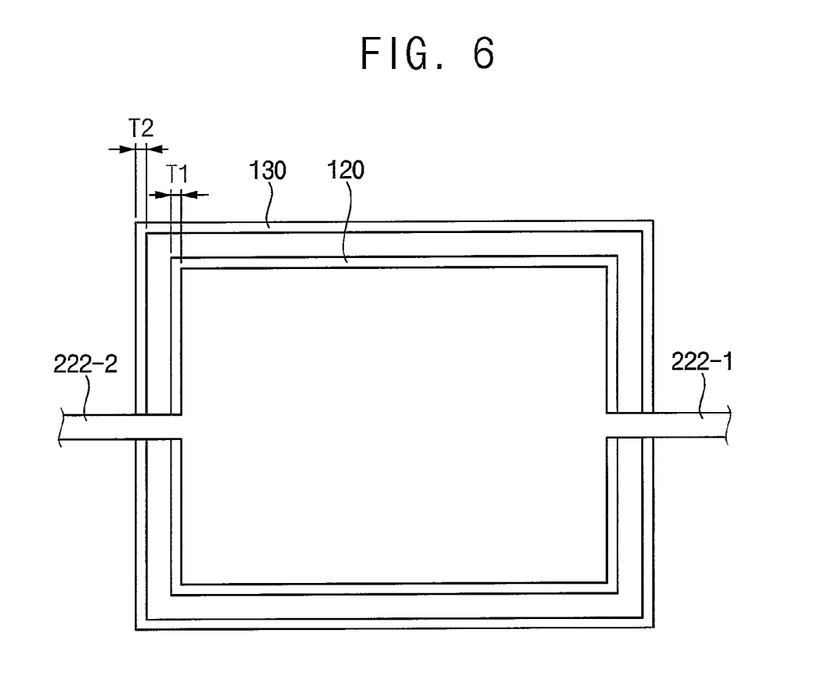
FIG. 6 is a cross-sectional view taken along a line C-C' in FIG. 5.
Figure 7:
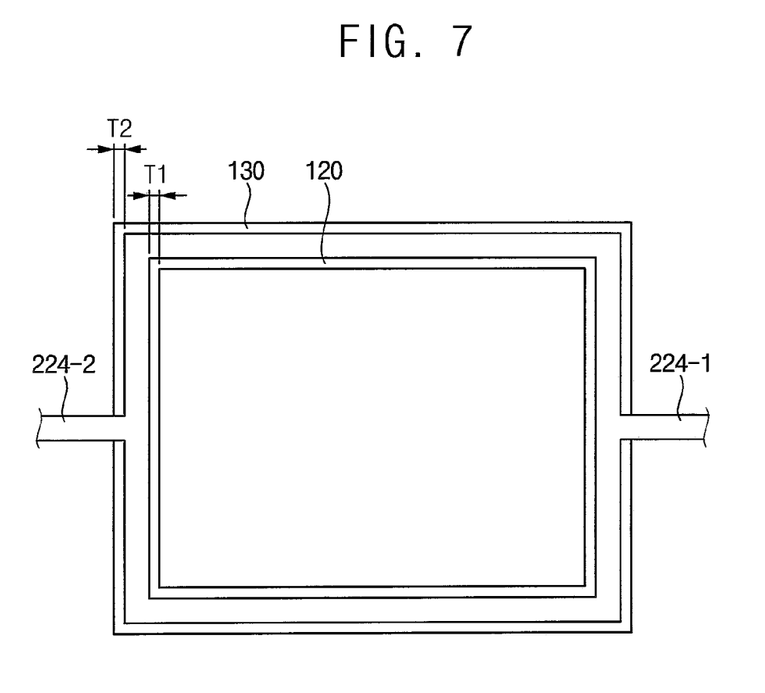
FIG. 7 is a cross-sectional view taken along a line D-D' in FIG. 5.

FIG. 5 is a cross-sectional view illustrating an apparatus for testing an object in accordance with example embodiments of the present disclosure, FIG. 6 is a cross-sectional view taken along a line C-C' in FIG. 5, and FIG. 7 is a cross-sectional view taken along a line D-D' in FIG. 5.

A test apparatus 100a may include elements substantially the same as those of the test apparatus 100 described above with reference to FIG. 1 except for first and second gas lines. Thus, the same reference numerals may refer to the same elements and to the extent that an element is not described in detail herein, that element may be assumed to be at least similar to corresponding elements described elsewhere in the present disclosure.

Referring to FIGS. 5 to 7, a first gas line may include a 1-1 gas line 222-1 and a 1-2 gas line 222-2. The 1-1 gas line 222-1 and the 1-2 gas line 222-2 may be connected to the first chamber 120. The 1-1 gas line 222-1 and the 1-2 gas line 222-2 may be spaced apart from each other by a uniform distance. Thus, the 1-1 gas line 222-1 and the 1-2 gas line 222-2 may be arranged, with respect to each other, with an angle of about 180°. Alternatively, the first gas line may include at least three gas lines spaced apart from each other by a uniform distance.

Because the first gas line may be branched into the 1-1 gas line 222-1 and the 1-2 gas line 222-2, the dry gas may be rapidly supplied to the first chamber 120.

A second gas line may include a 2-1 gas line 224-1 and a 2-2 gas line 224-2. The 2-1 gas line 224-1 and the 2-2 gas line 224-2 may be connected to the second chamber 130. The 2-1 gas line 224-1 and the 2-2 gas line 224-2 may be spaced apart from each other by a uniform distance. Thus, the 2-1 gas line 224-1 and the 2-2 gas line 224-2 may be arranged, with respect to each other, with an angle of about 180°. Alternatively, the second gas line may include at least three gas lines spaced apart from each other by a uniform distance.

Because the second gas line may be branched into the 2-1 gas line 224-1 and the 2-2 gas line 224-2, the dry gas may be rapidly supplied to the second chamber 130.

Figure 8:
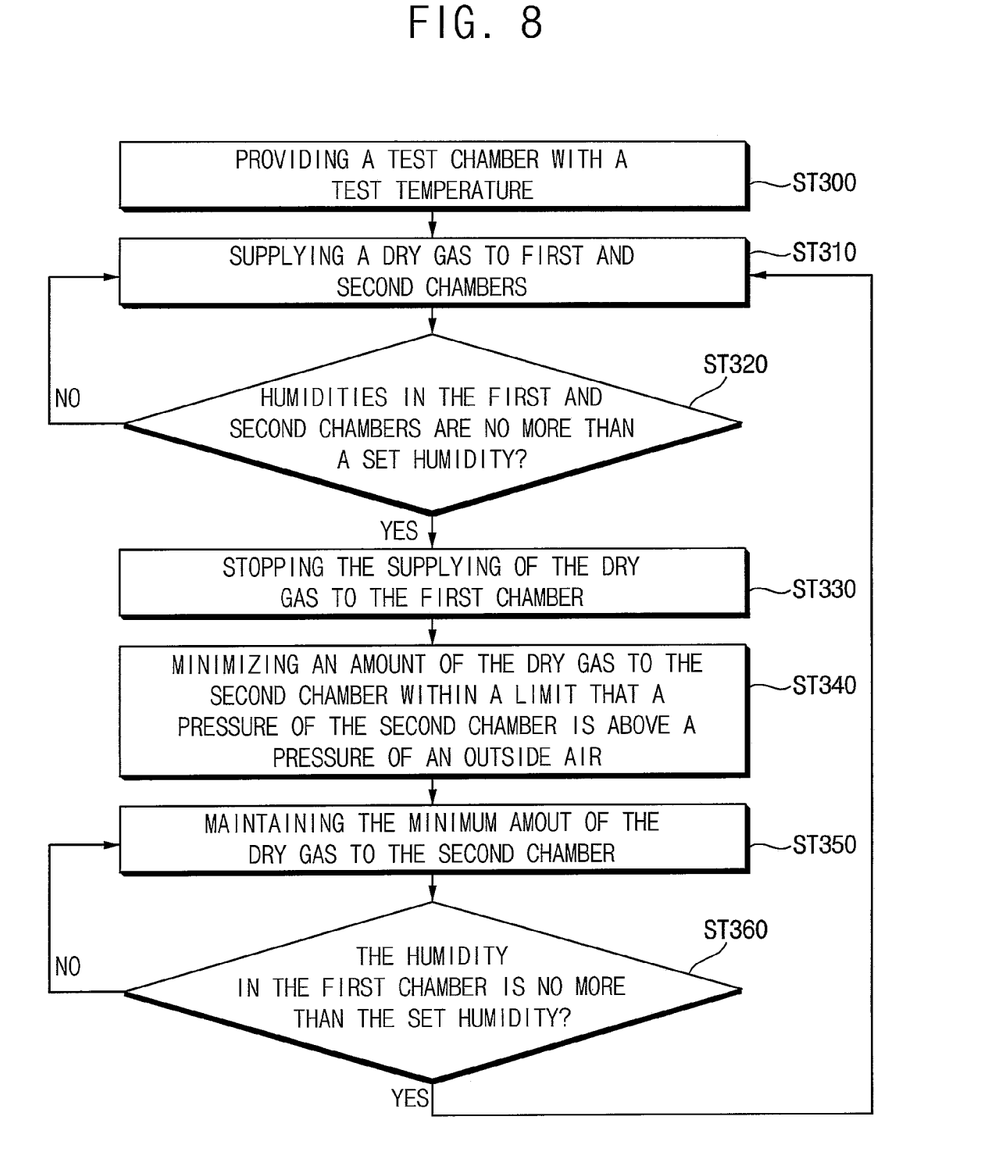
FIG. 8 is a flow chart illustrating a method of testing an object using the apparatus in FIG. 1.

FIG. 8 is a flow chart illustrating a method of testing an object using the apparatus in FIG. 1.

Referring to FIGS. 1 and 8, in step ST300, the temperature controller 114 may maintain the test chamber 110 at the test temperature, for example, by cooling the air disposed therein. When the semiconductor package P is tested within the test chamber 110 at the low temperature, the temperature controller 114 may maintain the test chamber 110 at the low temperature. In contrast, when the semiconductor package P is tested within the test chamber 110 at a high temperature, the temperature controller 114 may maintain the test chamber 110 at the high temperature, for example, by heating the air disposed therein.

In step ST310, the first controller 250 may open the first valve 230. The second controller 252 may open the second valve 232. The dry gas generated from the compressor 210 may be supplied to the first chamber 120 through the first gas line 222. Further, the dry gas may also be supplied to the second chamber 130 through the second gas line 224.

In step ST320, the first humidity sensor 240 may measure the first humidity in the first chamber 120. The measured first humidity may then be transmitted to the first controller 250. The second humidity sensor 242 may measure the second humidity in the second chamber 130. The measured second humidity may then be transmitted to the second controller 252.

The first controller 250 may compare the transmitted first humidity with the set humidity. The second controller 252 may compare the transmitted second humidity with the set humidity.

When the first and second humidities are above the set humidity, in step ST310, the dry gas may be continuously supplied to the first chamber 120 and the second chamber 130.

In contrast, when the first and second humidities are no more than the set humidity, in step ST330, the first controller 250 may close the first valve 230. Thus, the dry gas might not be supplied to the first chamber 120.

Particularly, when the first humidity may be above the set humidity, the dew condensation may be generated on the lower surface of the test board B. Thus, the first controller 250 may open the first valve 230 to supply the dry gas to the first chamber 120. As a result, the first humidity in the first chamber 120 may be decreased by the dry gas.

Further, when the second humidity is above the set humidity, the second controller 252 may determine the test apparatus 100 to be abnormal. In this case, the second controller 252 may open the second valve 232 to supply the dry gas to the second chamber 130. However, when the second humidity in the second chamber 130 does not decrease in spite of the supplying of the dry gas, the test apparatus 100 may be stopped. The test apparatus 100 may then be repaired.

After stopping the supplying of the dry gas to the first chamber 120, the first chamber 120 may be isolated from the ambient air by the second chamber 130. Thus, the transferring of the temperature of the ambient air to the first chamber 120 may be suppressed. As a result, the transferring of the temperature of the ambient air to the test board B through the first chamber 120 may also be suppressed. Further, the dry gas in the first chamber 120 might not be moved to the test chamber 110, the second chamber 130 and/or the outside. Thus, a low temperature of the test chamber 110 may cool the dry gas in the first chamber 120 during the low temperature test. The cooled dry gas may continuously remain in the isolated first chamber 120 to decrease temperature variances of the test board B and the semiconductor package P. As a result, a time for providing the test chamber 110 with the test temperature may be greatly reduced and a temperature variance in the test chamber 110 may also be decreased in the low temperature test.

In order to continuously provide the second chamber 130 with the function of preventing the gas ambient air from infiltrating into the first chamber 120, the pressure of the second chamber 130 may be maintained at a pressure that is higher than the pressure of the ambient air (e.g., the ambient pressure). However, because the second chamber 130 may already have positive pressure, it might not be required to maintain an initial supply amount of the dry gas for forming the positive pressure.

Therefore, in step ST340, within a limit that the pressure of the second chamber 130 may be above the pressure of the ambient air, i.e., the pressure of the second chamber 130 may be maintained to the positive pressure, the second controller 252 may decrease the opening angle of the second valve 232. As a result, the amount of the dry gas supplied to the second chamber 130 may be decreased. For example, the supply amount of the dry gas to the second chamber 130 may be minimized.

In step ST350, the opening angle of the second valve 232 may be maintained to continuously maintain the minimum supply amount of the dry gas to the second chamber 130.

In step ST360, when the first humidity measured by the first humidity sensor 240 is above the set humidity, the first controller 250 may continuously supply the dry gas to the first chamber 120 and the second chamber in step ST310.

In contrast, when the first humidity is no more than the set humidity, in step ST350, the minimum supply amount of the dry gas to the second chamber 130 may be continuously maintained.

The semiconductor package P may then be tested in the test chamber 110 while the test chamber 110 is maintained at the low temperature and the first and second chambers 120 and 130 may be maintained at or below the set humidity.

According to example embodiments, a chamber under the test chamber may be divided into the first chamber and the second chamber to provide the second chamber with the positive pressure that is higher than the pressure of the ambient air. Thus, during the testing of the object at a low temperature, the second chamber may function to prevent the humid ambient air from infiltrating into the first chamber to prevent condensation of water on the lower surface of the test board. Further, after providing the second chamber with the positive pressure, the dry gas may be supplied to only the second chamber, not to the first chamber so that an amount of the dry gas used in the low temperature test may be reduced.

The foregoing is illustrative of example embodiments of the present invention and is not to be construed as necessarily limiting on the instant invention. Although a few example embodiments have been described, those skilled in the art will readily appreciate that many modifications are possible in the example embodiments without materially departing from the novel teachings and aspects of the present invention. Accordingly, all such modifications are intended to be included within the scope of the present disclosure.

What is claimed is:

1. An apparatus for testing an object, the apparatus comprising:
    a test chamber;
    a test board for testing an object, the test board disposed within the test chamber;
    a first chamber adjacent to the test chamber with a lower surface of the test board exposed to the first chamber;
    a second chamber surrounding the first chamber such that the first chamber is disposed entirely within the second chamber; and
    a gas supply module supplying a dry gas to the second chamber and providing the second chamber with a positive pressure that is higher than an ambient pressure, thereby preventing the ambient air from infiltrating into the first chamber,
    wherein the first chamber and the second chamber are isolated from one another so as to prevent fluid communication therebetween, and
    wherein the second chamber is filled with the dry gas so as to prevent ambient air from entering the first chamber that is disposed entirely therein.

2. The apparatus of claim 1, wherein the gas supply module comprises:
    a compressor configured to generate the dry gas;
    a first gas line connected between the compressor and the first chamber; and
    a first valve disposed at the first gas line and configured to control a supplying of the dry gas to the first chamber.

3. The apparatus of claim 2, wherein the first gas line comprises a plurality of lines spaced apart from each other by a uniform distance.

4. The apparatus of claim 2, wherein the gas supply module further comprises:
    a first humidity sensor disposed in the first chamber and configured to measure a first humidity in the first chamber; and
    a first controller configured to control operations of the first valve in accordance with the first humidity in the first chamber measured by the first humidity sensor.

5. The apparatus of claim 4, wherein the first humidity sensor is disposed on the lower surface of the test board.

6. The apparatus of claim 2, wherein the gas supply module further comprises:
    a second gas line connected between the compressor and the second chamber; and
    a second valve disposed at the second gas line and configured to control a supplying of the dry gas to the second chamber.

7. The apparatus of claim 6, wherein the second gas line comprises a plurality of lines spaced apart from each other by a distance.

8. The apparatus of claim 6, wherein the gas supply module further comprises:
    a second humidity sensor disposed in the second chamber and configured to measure a second humidity in the second chamber; and
    a second controller configured to control operations of the second valve in accordance with the second humidity in the second chamber measured by the second humidity sensor.

9. The apparatus of claim 1, wherein the second chamber has a volume that is smaller than a volume of the first chamber.

10. The apparatus of claim 1, wherein the second chamber has a wall thickness that is thicker than a wall thickness of the first chamber.

11. The apparatus of claim 1, wherein the first and second chambers each include a heat-insulating material.

12. The apparatus of claim 1, wherein the first and second chambers each have a double tubular structure.

13. The apparatus of claim 1, wherein the first chamber has a first hole through which a cable connected to the test board passes, and the second chamber has a second hole through which the cable passes.

14. The apparatus of claim 13, further comprising:
    a first gasket disposed between an inner surface of the first hole and the cable; and
    a second gasket disposed between an inner surface of the second hole and the cable.

15. The apparatus of claim 1, further comprising a temperature sensor disposed in the test chamber and configured to measure an internal temperature of the test chamber.

16. The apparatus of claim 1, further comprising a temperature controller disposed in the test chamber and controlling a test temperature of the test chamber.

17. The apparatus of claim 1, wherein the object comprises a semiconductor package.

18. An apparatus for testing an object, the apparatus comprising:
    a test chamber;
    a test board for testing an object, the test board disposed within the test chamber;
    a first chamber adjacent to the test chamber with a lower surface of the test board exposed to the first chamber;

a second chamber at least partially surrounding the first chamber and isolating the first chamber from ambient air; and a gas supply module supplying a dry gas to the second chamber and providing the second chamber with a positive pressure that is higher than an ambient pressure, thereby preventing the ambient air from infiltrating into the first chamber, wherein the first chamber has an upper end in contact with a lower surface of the test chamber, and the second chamber has an upper end in contact with the lower surface of the test chamber.

19. An apparatus for testing an object, the apparatus comprising:

a test chamber;

a test board for testing an object, the test board disposed within the test chamber;

a first chamber adjacent to the test chamber with a lower surface of the test board exposed to the first chamber;

a second chamber surrounding the first chamber such that the first chamber is disposed entirely within the second chamber;

a compressor configured to supply dry gas to both the first chamber and the second chamber;

a first gas line connected between the compressor and the first chamber; and a first valve disposed at the first gas line and configured to control the supplying of the dry gas to the first chamber;

a first humidity sensor disposed in the first chamber and configured to measure a first humidity in the first chamber;

a first controller configured to control the first valve in accordance with the first humidity in the first chamber measured by the first humidity sensor;

a second gas line connected between the compressor and the second chamber; and a second valve disposed at the second gas line to control the supplying of the dry gas to the second chamber, wherein the first chamber and the second chamber are isolated from one another so as to prevent fluid communication therebetween, and wherein the second chamber is filled with the dry gas so as to prevent ambient air from entering the first chamber that is disposed entirely therein.

20. The apparatus of claim 19, further comprising:

a second humidity sensor disposed in the second chamber and configured to measure a second humidity in the second chamber; and a second controller configured to control the second valve in accordance with the second humidity in the second chamber measured by the second humidity sensor.

* * * * *